(12) United States Patent
Cohen

(10) Patent No.: US 8,930,778 B2
(45) Date of Patent: Jan. 6, 2015

(54) READ DISTURB EFFECT DETERMINATION

(71) Applicant: LSI Corporation, Milpitas, CA (US)

(72) Inventor: Earl T. Cohen, Oakland, CA (US)

(73) Assignee: Seagate Technology LLC, Cupertino, CA (US)

( * ) Notice: Subject to any disclaimer, the term of this patent is extended or adjusted under 35 U.S.C. 154(b) by 149 days.

(21) Appl. No.: 13/677,938

(22) Filed: Nov. 15, 2012

(65) Prior Publication Data

US 2014/0136883 A1 May 15, 2014

(51) Int. Cl.
*G06F 11/00* (2006.01)
*G06F 11/20* (2006.01)

(52) U.S. Cl.
CPC .................. *G06F 11/2094* (2013.01)
USPC ............... 714/704; 714/773; 711/165

(58) Field of Classification Search
CPC ............ G06F 12/0238; G06F 12/0246; G06F 12/0253; G06F 2212/7201
USPC ................. 714/5, 704, 773; 711/165
See application file for complete search history.

(56) References Cited

U.S. PATENT DOCUMENTS

| 7,099,190 | B2 | 8/2006 | Noguchi et al. ......... 365/185.09 |
| 7,430,693 | B2 | 9/2008 | Noguchi et al. ............. 714/710 |
| 7,453,728 | B2 | 11/2008 | Noguchi et al. ......... 365/185.09 |
| 7,818,525 | B1 * | 10/2010 | Frost et al. .................... 711/165 |
| 8,060,797 | B2 | 11/2011 | Hida et al. .................... 714/704 |
| 8,171,380 | B2 | 5/2012 | Yang et al. ..................... 714/774 |
| 8,189,379 | B2 | 5/2012 | Camp et al. ............. 365/185.02 |
| 8,190,842 | B2 | 5/2012 | Frost et al. .................... 711/165 |
| 8,219,861 | B2 | 7/2012 | Hida et al. .................... 714/723 |
| 8,281,220 | B2 | 10/2012 | Kitahara ....................... 714/764 |
| 2008/0288814 | A1 * | 11/2008 | Kitahara ........................... 714/5 |
| 2009/0216936 | A1 | 8/2009 | Chu et al. ...................... 711/103 |
| 2010/0122148 | A1 | 5/2010 | Flynn et al. ................... 714/773 |
| 2010/0180183 | A1 | 7/2010 | Hung et al. ................... 714/807 |
| 2010/0246244 | A1 | 9/2010 | Shimomura et al. .......... 365/158 |
| 2011/0225346 | A1 | 9/2011 | Goss et al. .................... 711/103 |
| 2012/0233391 | A1 | 9/2012 | Frost et al. .................... 711/103 |
| 2012/0236639 | A1 | 9/2012 | Camp et al. .............. 365/185.02 |
| 2012/0239972 | A1 | 9/2012 | Shibata et al. .................. 714/15 |
| 2012/0239992 | A1 | 9/2012 | Hida et al. .................... 714/718 |
| 2012/0246525 | A1 | 9/2012 | Shibata et al. ................ 714/704 |
| 2012/0260148 | A1 | 10/2012 | Hughes et al. ................ 714/773 |
| 2014/0108891 | A1 * | 4/2014 | Strasser et al. ................ 714/773 |

OTHER PUBLICATIONS

Sangwhan Moon, A.L. Narasimha Reddy, "Write Amplification due to ECC on Flash Memory or Leave those Bit Errors Alone", IEEE 2012, 6 pages.

* cited by examiner

*Primary Examiner* — Sam Rizk

(74) *Attorney, Agent, or Firm* — Christopher P. Maiorana, PC

(57) ABSTRACT

An apparatus comprising a non-volatile memory and a controller. The controller is coupled to the non-volatile memory and configured to (i) accumulate a read disturb count for a first region of the non-volatile memory, (ii) accumulate error statistics for a second region of the non-volatile memory, (iii) determine, based upon both the read disturb count and the error statistics, whether the first region has reached a read disturb limit, and (iv) in response to determining that the first region has reached the read disturb limit, relocate at least some data of the first region.

20 Claims, 5 Drawing Sheets

READ DISTURB EFFECT DETERMINATION

FIELD OF THE INVENTION

The present invention relates to non-volatile memory generally and, more particularly, to a method and/or apparatus for implementing a read disturb effect determination.

BACKGROUND OF THE INVENTION

Non-volatile memories (NVMs), such as NAND flash chips, suffer from a phenomenon called "read disturb". Read disturb refers to a condition where reading one cell in a NAND string (i.e., one bit of one page in a block) disturbs (causes errors in) all the other bits in the same string. The other bits are affected because to read one bit in a NAND string, a bypass current is applied to the gate of all the other bits in the NAND string. The bypass current acts as a weak form of programming, changing the charge distribution of the other bits and causing errors to accumulate in the other bits.

Reading a single page repeatedly will not cause read disturb errors on that page. However, the other pages in the same block (i.e., sharing the same NAND strings) as the page being read get disturbed and can accumulate additional errors. Read disturb acts as one source of errors in NAND flash. Other sources of errors can include but are not limited to (i) program disturb, (ii) retention, and (iii) erase and program noise. Program disturb errors are caused by inter-cell interference due to initial programming of adjacent cells. Retention errors are caused by loss of charge over time. Erase and program noise errors is due to imperfect erasing and/or programming.

A conventional method for preventing data loss due to the above errors is for a vendor to specify an error correction level that accounts for the effects, within certain limits. In one example, devices are rated with a vendor-specified "read disturb limit" such that read disturb does not cause excess errors (i.e., beyond the rated error correction level) as long as a read count (i.e., a count of the number of reads since the last erase/program) within a block is kept below the vendor-specified "read disturb limit." Similarly, a retention rating is provided such that retention loss will not cause excess errors over a specified period of time as long as the NAND flash chips are kept within a specified temperature range.

The read disturb limit is a number of reads of a given block after which the data in that block will be so disturbed (i.e., will have accumulated so many additional errors due to the reading operations) that the block should be re-written (i.e., the data should be copied to a new location), and the given block erased. The erased block can then be used as "new" for other data. Copying data to a new location is sometimes called garbage collection or recycling.

Recycling also is performed independent of read disturbs to reclaim free space that is generated when data is overwritten. For example, a Host, coupled to a Solid-State Disk (SSD) comprising NAND flash, writes first data to address X, and later writes second data to address X, rendering the first data unused. Because of the nature of NAND flash, the second data is stored in a different location in the SSD than the location of the first data. The location of the first data becomes unused and is re-claimed by recycling. The second data is sometimes referred to as "active" or "in-use" data, and the no-longer-used first data is sometimes referred to as "a hole." The NAND flash becomes a Swiss cheese of active data and holes over time. The free space represented by the holes needs to be reclaimed by recycling, for example, through periodic "read scrubs."

Each "read" in the read disturb limit is (defined as) a sequential read of all of the pages in a block. For example, a read disturb limit of 10K would mean that a given block, once programmed, can be sequentially read ten thousand times before the cells were so disturbed as to need corrective action. This would mean that every page in the block could be read 10K times (i.e., sequentially read the block 10K times). Looking at the disturb effect, each page gets (# pages−1)*10K disturbs (because each page is disturbed by all reads other than its own. Counting on a block basis, the safe limit is (# pages−1)*10K in this case.

Read disturb limits generally decrease with lifetime. As the NVM wears (e.g., as program/erase cycles increase for NAND flash), the read disturb limit gets lower. Typically, a conventional MLC (multi-level cell) NAND chip might have a read disturb limit of 10K near the beginning of its life (i.e., no or few program/erase cycles) and a read disturb limit of 1K at the end of its life (i.e., at/near the rated number of program/erase cycles).

It would be desirable to implement a read disturb effect determination.

SUMMARY OF THE INVENTION

The present invention concerns an apparatus comprising a non-volatile memory and a controller. The controller is coupled to the non-volatile memory and configured to (i) accumulate a read disturb count for a first region of the non-volatile memory, (ii) accumulate error statistics for a second region of the non-volatile memory, (iii) determine, based upon both the read disturb count and the error statistics, whether the first region has reached a read disturb limit, and (iv) in response to determining that the first region has reached the read disturb limit, relocate at least some data of the first region.

The objects, features and advantages of the present invention include providing a method and/or apparatus for implementing a read disturb effect determination that may (i) treat word disturb counts as a warning level rather than a mandate to migrate data, (ii) utilize block error statistics in conjunction with read disturb counts, (iii) adjust read counts based upon block error statistics, (iv) check an error rate of a block in response to the read count reaching a predetermined threshold, (v) dynamically track maximum observed error rate(s) and read count(s) over similar or different granularities, (vi), perform error rate sampling when few pages are repeatedly read, and/or (v) update error statistics and read counts on each read.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
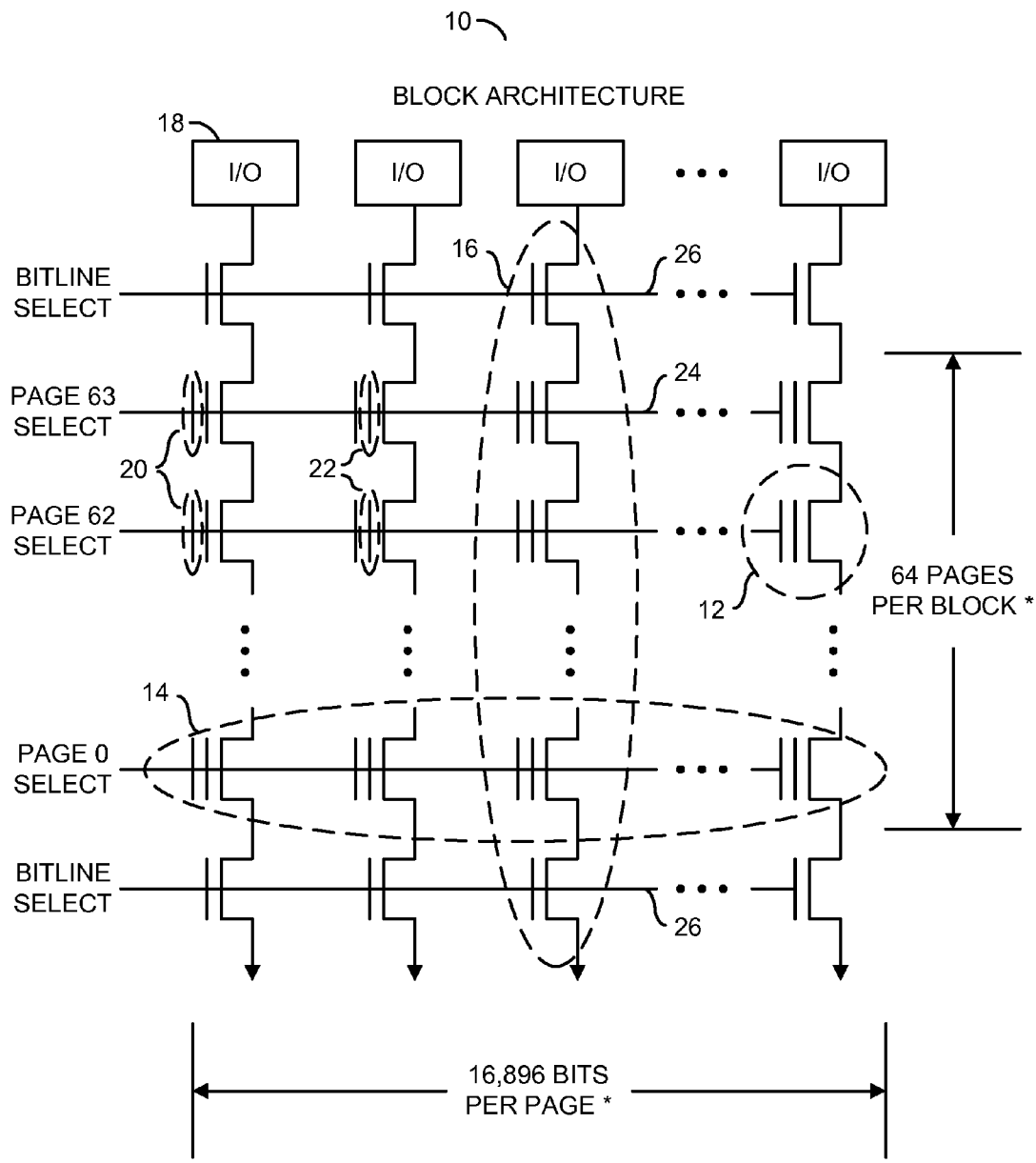
FIG. 1 is a diagram illustrating an example block architecture of a non-volatile memory device.

Referring to FIG. 1, a diagram is shown illustrating an example block architecture of a single level cell (SLC) NAND flash based non-volatile memory device. Flash memory cells are organized into a hierarchy of bytes, pages, blocks and planes. For example, in a block 10, memory cells 12 are arranged in a number of pages 14. In a typical 4 Gb SLC flash device, the block 10 may comprise 64 pages 14, and each page 14 may comprise 16,896 bits, each bit being implemented as a memory cell 12. NAND flash memory chips arrange the memory cells 12 in a logical "not-AND" (NAND) configuration. The NAND configuration forms a string 16 from all the memory cells 12 for a common input/output (I/O) bit line 18 across all of the memory pages 14. The NAND configuration does not allow individual data bytes within a memory page 14 to be directly accessed. A read operation performed by a flash memory controller has to read an entire memory page 14 from the flash device. Also, an entire memory page 14 is generally programmed at the same time. Each memory cell 12 comprises a control gate 20 and a floating gate 22. The control gates 20 for a page 14 are connected to a page select line 14. To access a page 14 of a block 10, bit line select lines 26 are asserted connecting the strings 16 between GND and bit lines 18.

Erasing the contents of a memory cell 12 is performed by placing a high voltage on the silicon substrate while holding the control gate 20 at zero. The electrons stored on the floating gate 22 tunnel through the oxide barrier into the positive substrate. Thousands of memory cells 12 are etched onto a common section of the substrate, forming a single block 10 of memory. All memory cells 12 in the block 10 are simultaneously erased when the substrate is "flashed" to a positive voltage. Thus, erase operations are generally in block units.

The memory cells 12 are programmed by placing a high voltage on the control gate 20 while holding source and drain regions at zero. The high electric field causes an N-channel to form and allows electrons to tunnel through the oxide barrier into the floating gate 22. Programming the memory cells 12 is performed one word at a time and usually an entire page is programmed in a single operation.

Figure 2:
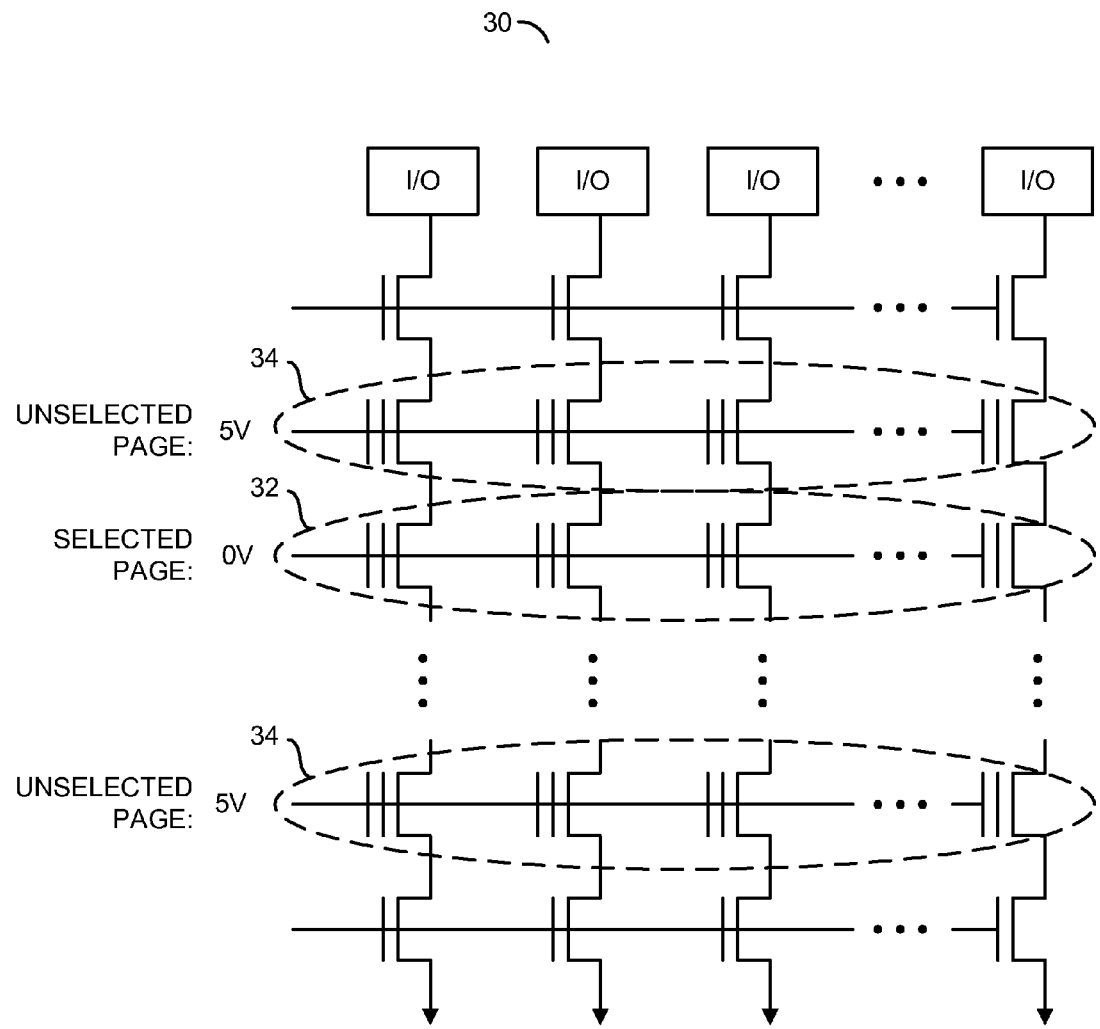
FIG. 2 is a diagram illustrating an example of read disturb.

Referring to FIG. 2, a diagram is shown illustrating an example of read disturb. Non-volatile memories (NVMs) such as NAND flash are subject to a phenomenon called "read disturb" in which reading one portion of the memory (e.g., a page 32) disturbs (causes errors in) other portions of the memory (e.g., pages 34). The conventional approach to read disturb is to have a limit of a fixed number of reads that can be performed before data must be re-written (copied to another location), so the "disturbed" location can be erased and then re-used for new or rewritten data. Embodiments of the present invention generally provide a more sophisticated handling of read disturbs to lessen the performance impact of re-writing data, and to provide additional benefits.

Figure 3:
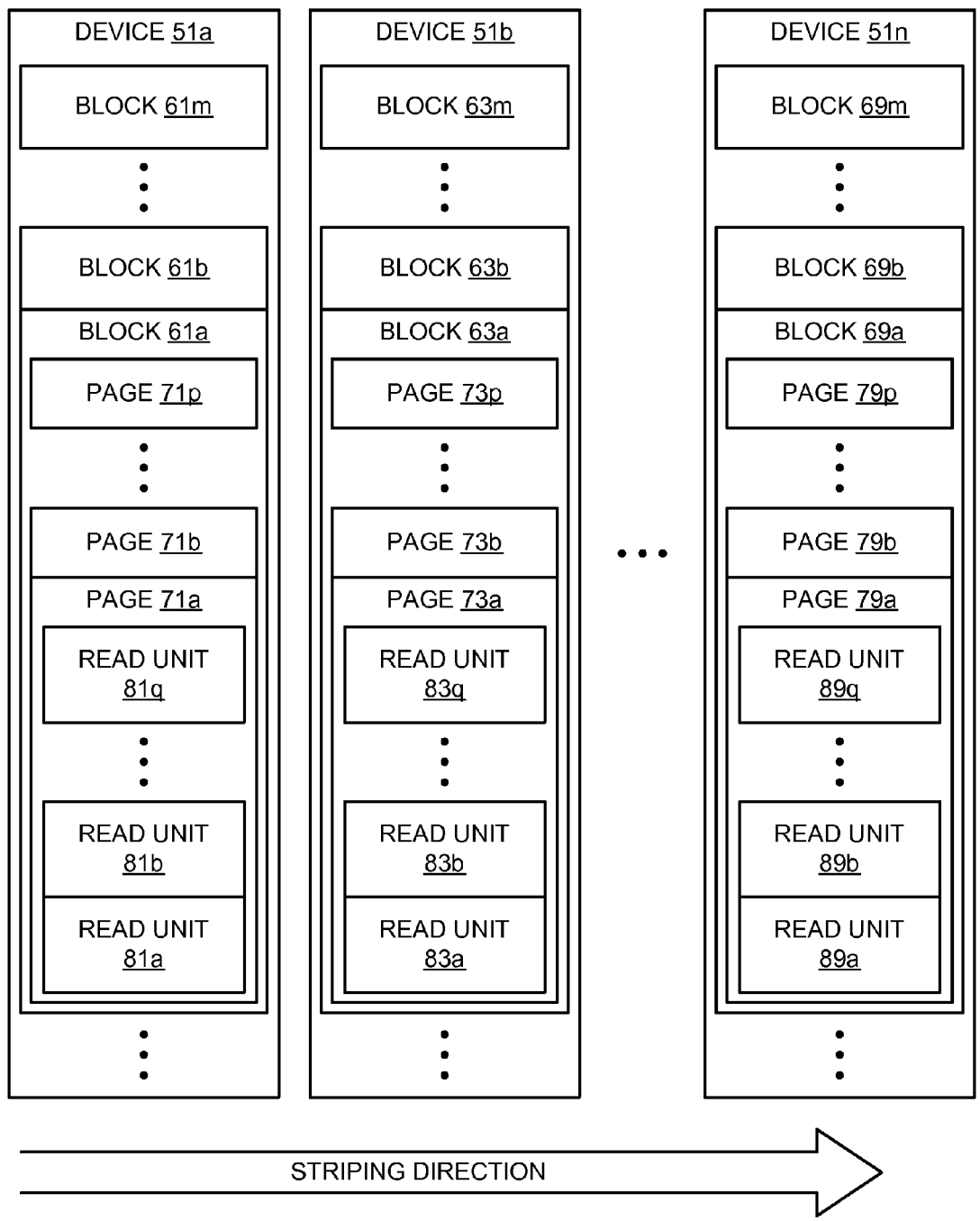
FIG. 3 is a diagram illustrating selected details of an embodiment of blocks, pages, and read units of multiple non-volatile memory devices.

Referring to FIG. 3, a diagram is shown illustrating a non-volatile memory (NVM) 50. In one example, the NVM 50 may comprise multiple non-volatile memory devices embodying a number of blocks, pages, and read units. For example, devices 51a-51n correspond to respective ones of one or more individual flash die. In some embodiments, devices 51a-51n are a portion of the non-volatile memory 50. For example, in various embodiments, data is striped independently across multiple groups of devices, where each of the groups of devices is independently accessible.

Each device (e.g., any one of the devices 51a, 51b, ..., and 51n) provides storage organized as blocks (e.g., blocks 61a, 61b, ..., and 61m of device 51a; blocks 63a, 63b, ..., and 63m of device 51b; and so forth). The blocks in turn include pages (e.g., pages 71a, 71b, ..., and 71p of block 51a; pages 73a, 73b, ..., and 73p of block 51b; and so forth). The pages in turn include read units (e.g., read units 81a, 81b, ..., and 81q of page 71a; read units 83a, 83b, ..., and 83q of page 71b; and so forth). Reads and/or writes of information in the devices are performed according to an order, such as a 'read unit first' order or a 'page first' order. An example of a read unit first order for read units illustrated in FIG. 3 begins with read unit 81a followed by units 83a, ..., 89a, 81b, 83b, ..., 89b, and so forth, ending with unit 89q. An example of a page first order for read units illustrated in FIG. 3 begins with read unit 81a followed by units 81b, ..., 81q, 83a, 83b, ..., 83q, 89a, 89b, and so forth, ending with unit 89q.

A non-volatile memory (NVM) chip, such as a NAND flash chip, is divided into one or more planes (e.g., two planes). Each plane is divided into a plurality of blocks (e.g., 1024 blocks). Each block is divided into a plurality of pages (e.g., 128 pages). Each page comprises a number of bytes used for both user data and ECC (error correction code) data (e.g., 8192 B+640 B=8832 B). According to various embodiments, the amount of user data enabled to be stored in one of the pages is one or more of: same for all pages; different for at least some of the pages; and equal to the largest power-of-two number of bytes that fits within the page. In some embodiments, a portion of the data stored in each of the pages is meta-data, such as logical block addresses of data stored within the page. Generally, bytes not used for user data are used for ECC or meta-data.

Blocks in NVM chips, such as NAND flash chips, are the unit that can be erased (cleared to enable new data to be written). Pages in NVM chips, such as NAND flash chips, are the unit that can be programmed (written with new data). Pages are also the unit of transfer from a page buffer of the NAND flash chips to or from the NAND array that non-volatilely stores the data. A read operation transfers a page from the NAND array to the page buffer, and a program operation transfers a page from the page buffer to the NAND array. In some NAND flash chips, data in the page buffer can be randomly accessed (until the page buffer is re-used for a subsequent program or read operation).

In some NVM chips with a plurality of planes, multi-plane operations are supported allowing one page from each plane to be programmed or to be read substantially in parallel. Multi-plane programming, for example, improves write bandwidth by writing more data (one page from each of a plurality of planes) substantially in parallel.

A vendor-specified read disturb limit (e.g., RDD) having a value of R for a non-volatile memory (NVM) means that a given block of the NVM, once programmed, can be sequentially read R times. If there are P pages per block, then the read disturb limit R implies that any given page can be disturbed $(P-1)*R$ times before the page is disturbed enough to violate the vendor-specified limits. That is, each page is allowed to see the read disturb effects of reading P−1 other pages R times without exceeding the vendor-specified ECC limits.

Vendor-specified ECC limits are generally given as a number of bits of correction per 1 KB of user data. For example, specifications of 40-bits of correction per 1 KB of user data are common. A 1 KB BCH code that can correct 40 bit-errors would require 70 B of extra space for the ECC. For example, in a device storing 1024 B of user data and 70 B of ECC data, any error pattern up to 40 bits wrong within the 1094 B could be corrected. This 1 KB BCH code has a ~93.6% code rate. The code rate is the ratio of user data to total length.

Generally, longer codes are stronger and provide better protection against random errors, even with the same amount of ECC data. For example, a 2 KB BCH that can correct up to 56 bit errors is about equivalent in protection against random errors to the 40-bit-correcting, 1 KB BCH code, but the 2 KB BCH code uses only 105 B of ECC data. Thus, the 2K BCH code uses only about 1.5× as much ECC data as the 1 KB BCH code. The 2 KB BCH code has a ~95.1% code rate, meaning that a higher percentage of the space is used for the user data. A 2 KB BCH code with 140 B of ECC data (twice that of the 1 KB BCH code, and thus having the same code rate) can correct 74 bit-errors and can protect against almost twice the random error rate as the 1 KB BCH code.

In various embodiments, each page of the flash is divided into one or more ECC-pages (or simply Epages). Each Epage is an amount of user data and the corresponding ECC data that, together, comprise one ECC codeword (e.g., a correctable unit). Typically, there are an integer number of Epages per page of the flash, or in some embodiments, per multi-plane page. Since the Epages are the basic unit that can be read and corrected, Epages are also called "read units." Typically, read units may have 1 KB or 2 KB of user data, and an even share of the remaining bytes in the flash page (so that all read units are the same total size).

Vendors specify read disturb limits that are conservative and there are multiple reasons why simply reaching the read disturb limit does not imply that a given block has been disturbed enough to cause an issue. For example, the time period over which the read disturbs happen has an impact due to retention effects. Generally, retention drift lowers charge in cells, and read disturb (acting as a weak program) raises charge, but both serve to blur the true data values. Thus, read disturbs happening over a shorter period will tend to be less of an issue than read disturbs happening over a longer period during which retention creates more additional errors. Process variation means that different die will behave differently, and not all die will be as susceptible to read disturb. Not all blocks in a given die are equal—some blocks may be more susceptible to read disturbs than others. Not all pages in a block are equal. For example, for some NAND flash chips, pages at the ends of a block tend to have different error characteristics than pages in the middle. The read disturb limit needs to be conservative to account for those differences.

The vendor-specified read disturb limit is defined based on the vendor-specified ECC limit. If a weaker (higher-rate) ECC code is used, read disturbs may generate errors that reach the limits of the weaker ECC code prior to the vendor-specified read-disturb limit. Or, if a stronger (lower-rate) ECC code is used, read disturbs may generate errors that do not reach the limits of the stronger ECC code until well after the vendor-specified read-disturb limit. Some systems use a variable code rate where, for example, upper versus lower pages, or end versus middle pages use different code rates to account for different expected error rates. When different code rates are used within a block, not all pages are as susceptible to read disturb—it is not that there are fewer errors, but that stronger (lower) code rates can correct more errors and thus more errors can be allowed to accumulate. For example, if end pages are known to be weaker and are given a lower code rate than a vendor-specified code rate used for the middle pages, a read disturb limit that is specified to be adequate for the end pages (but using the vendor-specified code rate) might end up being conservative. The bottom line is that there is a lot of variability, and particularly (though not exclusively) with stronger codes than the vendor-specified ECC limit and/or with variable code rates, read disturb limits may be too conservative.

Embodiments of the present invention resolve these issues by treating the read disturb limit as an "advisory" limit and using additional information to determine if there is a read disturb (or other) issue. Read disturb counts (e.g., a number of reads) are tracked over a first granularity of the NVM. Error statistics are tracked over a second granularity of the NVM. When the read disturb count in a given region of the first granularity reaches a determined limit, the error statistics seen in one or more regions of the second granularity that overlap with the given region are examined, and a determination is made as to whether (i) the read disturb count of the given region should be adjusted downwards or (ii) the given region has reached its read disturb limit and needs to be re-written. The determined limit may be determined up front (e.g., predetermined) or as part of a dynamic error handling process (e.g., on the fly).

In other words, the read disturb counts are used in conjunction with the error statistics to determine whether there is an actual read disturb problem. Reading can continue until a combination of the read disturb count and the error rate reach a specified level. In some embodiments, the read disturb count acts as a warning mechanism to cause the block error statistics to be examined. Using the read disturb count a warning level avoids issues such as reading only one (or a small number) of pages in a block and thus disturbing all other pages in the block. Without some mechanism to check the status of the other pages, the other pages may potentially accumulate an unacceptable number of errors from read disturb.

While read scrub (background reading of all pages, or all active pages to determine if the pages are experiencing too high an error level) will also detect read disturb effects, read scrub of an Solid-State Disk (SSD) is generally done on a time scale of daily or weekly and is used primarily for retention and other issues. A single page in a block could be read at a rate of more than 10K times per second with most types of NAND flash. With a 10K read disturb limit and 256 pages per block, there could, for example, be a read disturb problem generated in minutes. The time scale over which read scrub works is inadequate to detect read disturb issues, and increasing the frequency of read scrub starts to be a performance issue, particularly on a large SSD.

Figure 4:
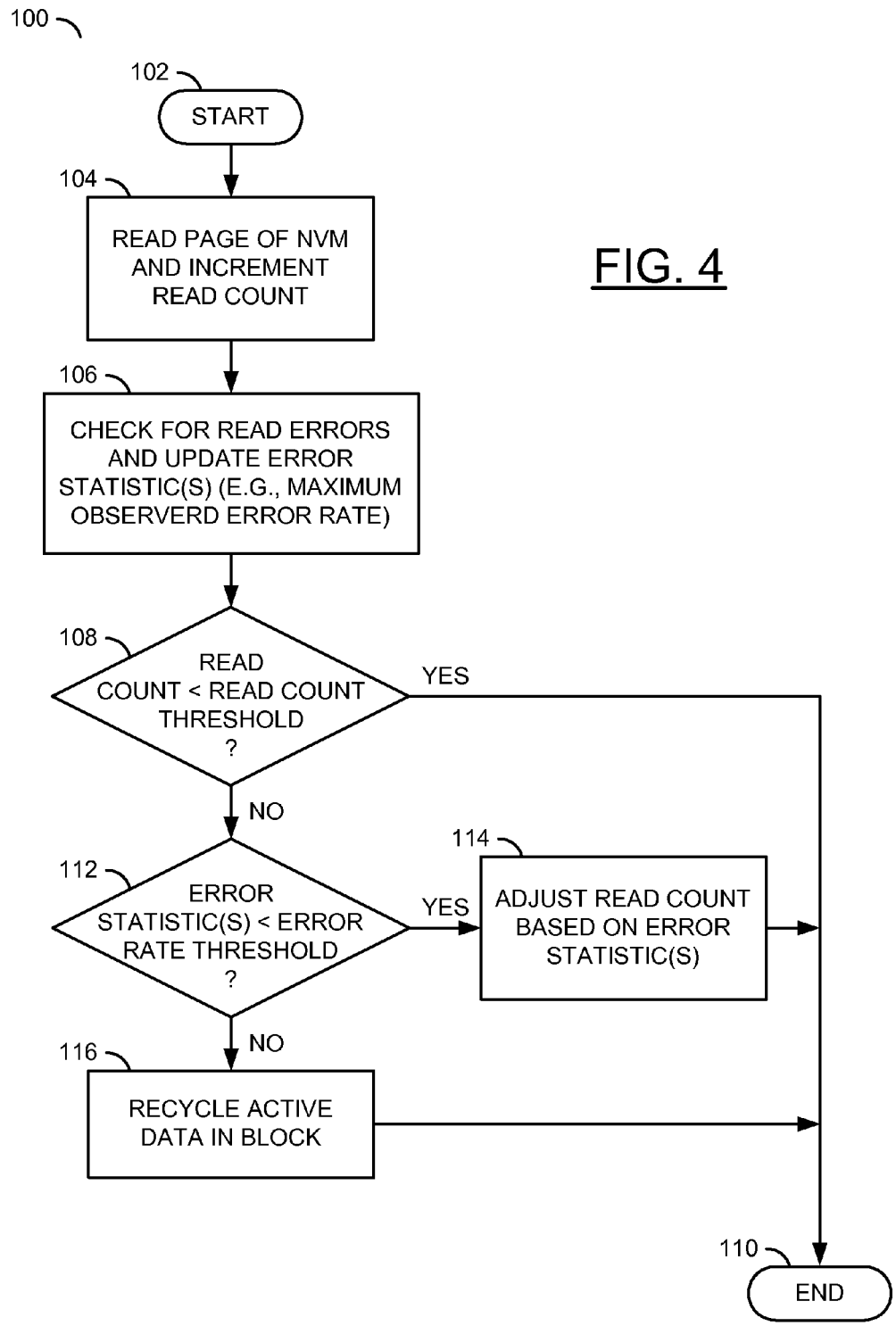
FIG. 4 is a flow diagram illustrating a process of read disturb effect determination in accordance with an embodiment of the present invention.

Referring to FIG. 4, a flow diagram is shown illustrating a read disturb effect determination process 100 in accordance with an embodiment of the present invention. The process (or method) 100 may comprise a step (or state) 102, a step (or state) 104, a step (or state) 106, a step (or state) 108, a step (or state) 110, a step (or state) 112, a step (or state) 114, and a step (or state) 116. The process 100 may begin in the state 102 and move to the state 104 upon a read request. In the step 104, the process 100 may read a page from the non-volatile memory and increment a read disturb count for the region containing the page read, when the page has been read, the process 100 may move to the state 106 where a check is made for any errors in the data read. Error statistics (e.g., a maximum observed error rate, etc.) for the particular error region in which the page is located are then updated based upon the current read. The regions associated with the read disturb count and error statistics may have similar or different granularities. The process 100 may then move to the state 108.

In the state 108, the process 100 compares the read disturb count with a determined read disturb count threshold. If the read disturb count is less than the determined read disturb count threshold, the process 100 may move to the state 410 and terminate. Otherwise, the process 100 moves to the state 412. In the state 412, the process 100 may check the error statistic(s) for the region read from and determined whether an error rate is less than a determined error rate threshold for the particular region. When the error rate is less than the determined error rate threshold, the process 100 may move to the state 114. Otherwise, the process 100 may move to the state 116.

In the state 114, the process 100 may adjust the read disturb count based upon the error statistics. For example, when the actual error rate is low, the process 100 may reduce the read disturb count (e.g., by an amount based upon criteria taking into account the error statistics) to delay a recycling operation. After adjusting the read disturb count the process 100 may move to the step 110 and terminate. In the state 116, the process 100 may schedule the block from which the current read was performed for recycling. The block is scheduled for recycling to avoid having errors due to the read disturb effect exceed the correction capability of the system. The process 100 then moves to the state 110 and terminates.

Respective read disturb counts (e.g., a count of how many page reads have been performed) may be accumulated for each of a plurality of regions of a first granularity of the NVM. For example, the first granularity may be a block, or an integer number of blocks, or a dual-plane block, or a quad-plane block, or any combination of the foregoing across one or more NAND chips. When a given one of the regions of the first granularity is erased and/or is programmed, the corresponding read disturb count is zeroed. Thereafter, the corresponding read disturb count is incremented according to reads of the NVM in the given region. For example, in some embodiments, each page access command (e.g., causing a transfer of information from the NAND array to the page buffer within one or more NAND chip containing the given region) increments the read disturb count of the given region. In other embodiments, the read disturb count is incremented on each separate transfer of data from the NAND chip, even if, for example, that transfer only accessed data that was already in a page buffer of the NAND chip and did not cause a transfer of information from the NAND array to the page buffer.

Error statistics are accumulated for each of plurality of regions of a second granularity of the NVM. In some embodiments, the error statistics of a given region represent a maximum percentage of the error correction ability used by any read within the given region. For example, the second granularity may be a block, or an integer number of blocks, or a dual-plane block, or a quad-plane block, or any combination of the foregoing across one or more NAND chips. In some embodiments, the second granularity is the same as the first granularity. In other embodiments, the second granularity is different from the first granularity. In still other embodiments, the first and second granularities may be configurable (programmable).

In some embodiments, the error statistics are reset (e.g., cleared) when a given one of the regions of the second granularity is erased and/or is programmed. Subsequently, each time data is retrieved from the given region (optionally and/or selectively whether the retrieval required a transfer of information from the NAND array to the page buffer within the NAND chip or could be satisfied from the page buffer) and error corrected, a result of the error correction is selectively used to update the error statistics of the given region.

According to various embodiments, the error statistics of a given region may comprise one or more of: an average number of bit errors corrected among all Epages read from the given region; a maximum number of bit errors corrected in any Epage read from the given region; an indication that an uncorrectable Epage was read from the given region; an average fraction (such as a percentage) of the correction ability used among all Epages read from the given region; a maximum fraction (such as a percentage) of the correction ability used in any Epage read from the given region; and any combination of the foregoing.

In some embodiments, using a percentage of the correction ability as one of the error statistics enables effects of variable code rates to be equalized. For example, if a first page within the given region uses a first code rate and a second page within the given region uses a second code rate different from the first code rate, then a fraction of the correction ability used to correct Epages with the first code rate is more comparable to a fraction of the correction ability used to correct Epages with the second code rate than a comparison of absolute metrics such as a number of errors corrected with each of the two code rates.

For some decoding techniques, such as Low-Density Parity-Check Codes (LDPC), there may not be a bounded/defined error correction ability. According to various embodiments, the error correction ability of an LDPC code is assumed to be one or more of: the same as the error correction ability of a similar-sized (or same-sized) BCH code at a same rate; the same as the error correction ability of a vendor-specified BCH code at a same rate; an error correction ability according to the length and/or the rate of the LDPC code; or any other method of determining a nominal error correction ability.

One example implementation computes statistics on a block basis, both for read disturb counts (RDC) and for block error statistics (BES). The block error statistics may, in one example, be maintained on a relative scale by computing for each Epage read a ratio of the number of errors corrected to a correction limit, the correction limit based on a code rate of the ECC code used for the correction. The block error statistic is then the maximum ratio observed, optionally truncated to a fixed maximum.

For example, BES values can be computed in this form using an equation such as: new value=max(old_value, min(7, floor(8*observed_errors/correction_limit)), where observed_ errors is the number of errors corrected (e.g., in a given Epage, assuming each Epage is processed individually, or the maximum number of errors seen over a group of Epages read at one time and using the same code rate), and correction_ limit is an estimate of how many errors (maximum) the particular code used for the group of Epages might correct. Observed_errors might exceed correction_limit in some cases, since the correction ability of codes such as LDPC is variable, unless correction_limit was undesirably raised to prevent this, sacrificing precision in the BES value. The correction limit is generally a function of the code rate used for the given Epage.

When the RDC for a given block reaches a threshold (e.g., a point at which recycling for read disturb might be necessary), BES is examined and the BES value is used to determine the action. Based on the observed BES level, the block may not have to be immediately moved (re-written) due to read disturb, and instead the RDC count for the block may be adjusted downward (e.g., by an amount based upon the magnitude of the observed BES level). Thus, the alarm generated by the RDC is reset based on the magnitude of errors seen. When used in conjunction with BES, RDC thus acts as a timeout indicating that BES for a given block should be examined, and not solely as an indication that the block needs to be moved immediately. For example, the following pseudo-code illustrates how the RDC value may be updated in an example implementation:

```
if (RDC == RDC_THRESHOLD_VALUE) {
    // Optionally and/or selectively test pages in
    // the block prior to evaluating BES
    if (BES >= BES_THRESHOLD_VALUE) {
        // Take Action - migrate the block!!
    }
    else {
        // BES is still "safe" - adjust RDC
        // downwards
        RDC = RDC - (RDC >> BES);
    }
}
else {
    RDC = RDC + 1;
}
```

As in the pseudo-code above, when the RDC value is at the threshold, BES is examined. If BES is small enough, RDC is reduced and more reads are allowed. Otherwise if BES is already indicating potential issues, the block needs to be migrated. While the example implementation shows RDC being adjusted downwards proportional to BES, various implementations may adjust RDC in other ways, such as by a fixed amount, by a fixed ratio, or by any function of RDC and BES.

As explained above, read disturb does not affect the page being read, and it is the un-read pages that accumulate errors. Further, the block error statistics are generally only accumulated over the pages that are actually read. A pathological case could occur if one (or a small number) of pages in a block were read repeatedly—all other pages would be disturbed, but the block error statistics would not account for this. For this reason, in some embodiments, when the read disturb count reaches the threshold value, a small sample of pages in the region covered by the read disturb count are read (and error corrected) prior to examining the block error statistics covering that region. The page sampling prevents unread (but disturbed) pages from escaping being accounted. According to various embodiments, the small sample of pages may be one or more of: a random sample of pages; a fixed sample of pages; at least three pages; at least four pages; at least five pages; a sufficient number of pages to ensure read disturb issues are not overlooked; and any other number of pages.

The behavior of read disturb is such that if only n pages in a block are read in rotation, those n pages each see a fraction of the read disturb effect seen by the other pages in the block of at least (n−1)/n. For example, if only four pages were ever read, the worst of the four pages would at least see 75% of the read disturb effect of the other pages. Thus reading a small sample of the pages in the block when the read disturb count reaches the threshold value ensures that the block error statistics are reporting the worst case within a desired degree of accuracy according to the number of pages the small sample. In some embodiments, the BES threshold (for recycling the block) is adjusted to take this into account. In various embodiments, the number of pages in the small sample is varied based at least in part on how close the BES value is to the BES threshold. For example, the closer the BES value is to the BES threshold, the larger the number of pages in the small sample. In some embodiments, since BES and RDC are both updated per read, RDC and BES may be stored in a single, combined structure. For example, 3 bits of BES and 13 bits of RDC stored in a 16-bit value for each block.

In various embodiments, read scrubbing or some other equivalent background monitoring is used to ensure that all pages in a given block are healthy due to effects such as retention.

While the discussion has focused on NAND flash, the techniques described herein are applicable to other types of NVM. In some embodiments the NVM may be heterogeneous (e.g., comprised of two or more types of NVM with different properties or characteristics). The read disturb counts can be tracked over regions of differing granularities. The error statistics can be tracked over regions of differing granularities. Counters, such as read disturb counts, can count up to a maximum as described, or alternatively can count down to a minimum. Error statistics have been described as tracking a maximum observed percentage of a correction ability, whereas in other embodiments, any tracking of the relative strength of correction ability used would suffice. Or tracking other correction metrics, such as a minimum remaining number of bit errors that could be corrected. Any thresholds or limits may be specified in advance, or may be functions of any of the other counts and/or statistics. For example, in some embodiments, the read disturb count threshold is according to the block error statistics. In some embodiments, the error statistics reaching a specified maximum may also trigger recycling, independent of the read disturb counts.

Figure 5:
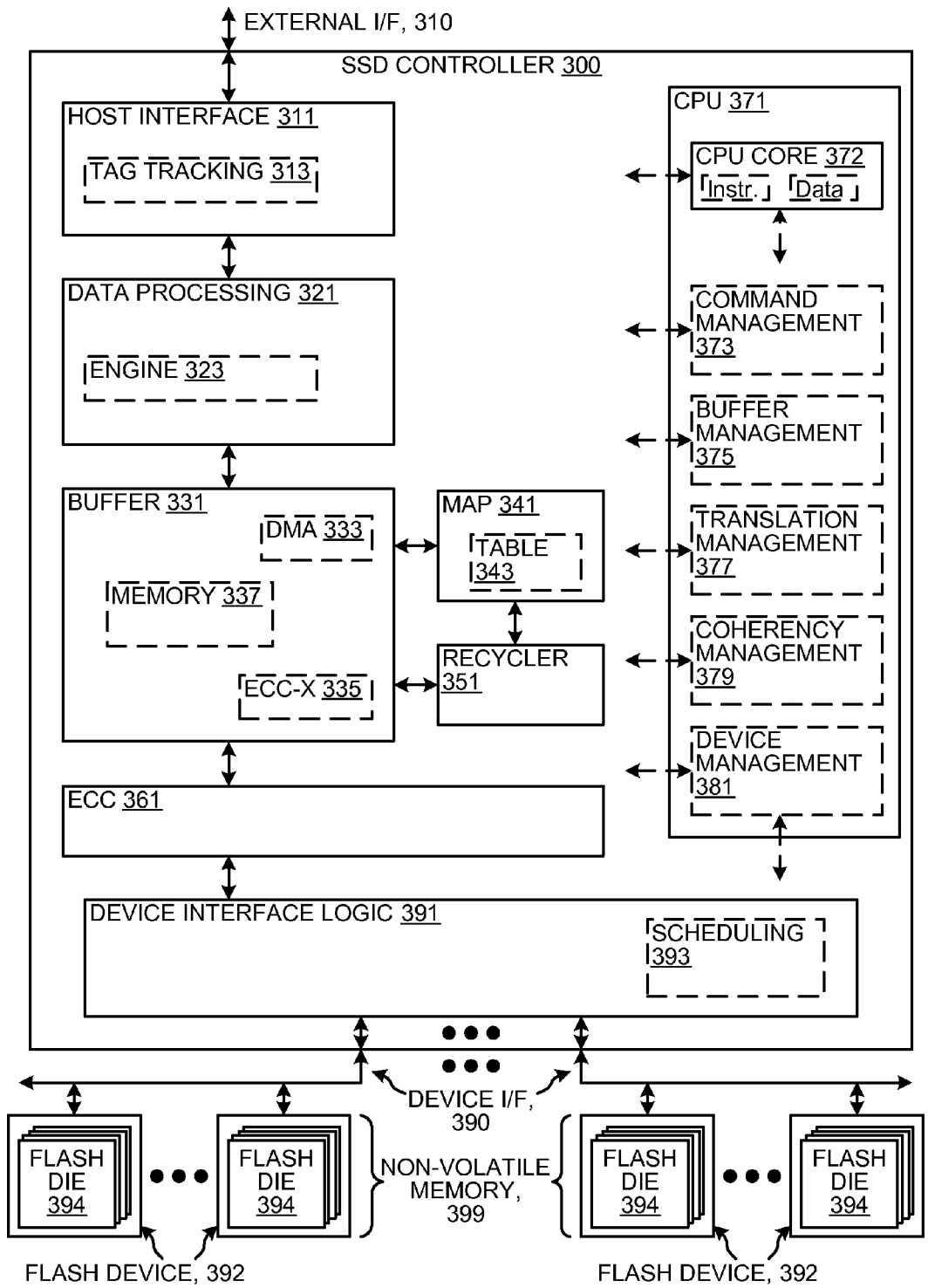
FIG. 5 is a diagram illustrating an embodiment of a Solid-State Disk (SSD) including an SSD controller implementing

Referring to FIG. 5, a diagram is shown illustrating a solid-state disk (SSD) including an SSD controller 300 in which read disturb effect determination techniques in accordance with an embodiment of the present invention may be implemented to migrate data in non-volatile (e.g., Flash) memory before an error rate becomes too high to correct. The SSD controller 300 may be coupled via one or more external interfaces 310 to a host (not shown). According to various embodiments, external interfaces 310 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the SSD controller 300 includes a SATA interface and a PCIe interface.

The SSD controller 300 is further coupled via one or more device interfaces 390 to non-volatile memory 399 including one or more storage devices, such as flash devices 392. According to various embodiments, device interfaces 390 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

The Flash devices 392 have, in some embodiments, one or more individual flash die 394. According to a type of a particular one of the flash devices 392, a plurality of flash die 394 in the particular flash device 392 are optionally and/or selectively accessible in parallel. The Flash devices 392 are generally representative of one type of storage device enabled to communicatively couple to SSD controller 300. However, in various embodiments, any type of storage device is usable, such as an SLC NAND flash memory, MLC NAND flash memory, NOR flash memory, read-only memory, static random access memory, dynamic random access memory, ferromagnetic memory, phase-change memory, racetrack memory, or any other type of memory device or storage medium.

According to various embodiments, the device interfaces 390 are organized as: one or more busses with one or more flash devices 392 per bus; one or more groups of busses with one or more flash devices 392 per bus, where busses in a group are generally accessed in parallel; or any other organization of flash devices 392 coupled to device interfaces 390.

The SSD controller 300 may have one or more modules, such as a host interface module 311, a data processing module 321, a buffer 331, a map 341, a recycler 351, an error-correcting code (ECC) module 361, a central processing unit (CPU) 371, and device interface logic 391. The specific modules and interconnections illustrated in FIG. 5 are merely representative of one embodiment, and many arrangements and interconnections of some or all of the modules, as well as additional modules not illustrated, may be implemented to meet the design criteria of a particular implementation. In a first example, in some embodiments, there are two or more host interfaces 311 to provide dual-porting. In a second example, in some embodiments, the data processing module 321 and/or the ECC module 361 are combined with the buffer 331. In a third example, in some embodiments, the host interfaces 311 are directly coupled to the buffer 331, and the data processing module 321 optionally and/or selectively operates on data stored in the buffer 331. In a fourth example, in some embodiments, the device interface logic 391 is directly coupled to the buffer 331, and the ECC module 361 optionally and/or selectively operates on data stored in the buffer 331.

The host interface 311 sends and receives commands and/or data via the external interface 310, and, in some embodiments, tracks progress of individual commands via the tag tracking module 313. For example, the commands include a read command specifying an address (such as an LBA) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. In some embodiments, the host interface 311 is compatible with a SATA protocol and, using NCQ commands, is enabled to have up to 32 pending commands, each with a unique tag represented as a number from 0 to 31. In some embodiments, the tag tracking module 313 is enabled to associate an external tag for a command received via the external interface 310 with an internal tag used to track the command during processing by SSD controller 300.

According to various embodiments, one or more of: data processing module 321 optionally and/or selectively processes some or all data sent between the buffer 331 and the external interfaces 310; and data processing module 321 optionally and/or selectively processes data stored in the buffer 331. In some embodiments, the data processing module 321 uses one or more engines 323 to perform one or more of: encrypting; decrypting; compressing; decompressing; formatting; reformatting; transcoding; and any other data processing and/or manipulation task.

The buffer 331 stores data sent to/from the external interfaces 310 from/to the device interfaces 390. In some embodiments, the buffer 331 additionally stores system data, such as some or all map tables, used by the SSD controller 300 to manage the flash devices 392. In various embodiments, the buffer 331 has one or more of: a memory 337 used for temporary storage of data; a direct memory access (DMA) modules 333 used to control movement of data to and/or from the buffer 331; an ECC-X module 335 used to provide a higher-level error correction function; and other data movement and/or manipulation functions. An example of a higher-level error correction function is a RAID-like capability, where redundancy is at a flash device (e.g. multiple ones of the flash devices 392) level and/or a flash die (e.g. flash die 394) level instead of at a disk level.

According to various embodiments, one or more of: the ECC module 361 optionally and/or selectively processes some or all data sent between the buffer 331 and the device interfaces 390; and the ECC module 361 optionally and/or selectively processes data stored in the buffer 331. In some embodiments, the ECC module 361 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding.

The device interface logic 391 controls the flash devices 392 via the device interfaces 390. The device interface logic 391 is enabled to send data to/from the flash devices 392 according to a protocol of the flash devices 392. The device interface logic 391 includes a scheduling module 393 to selectively sequence control of the flash devices 392 via the device interfaces 390. For example, in some embodiments, the scheduling module 393 is enabled to queue operations to the flash devices 392, and to selectively send the operations to individual ones of the flash devices 392 (or the flash die 394) as individual flash devices 392 (or flash die 394) are available.

The map 341 converts between data addressing used on the external interfaces 310 and data addressing used on the device interfaces 390, using table 343 to map external data addresses to locations in the non-volatile memory 399. For example, in some embodiments, the map 341 converts logical block addresses (LBAs) used on the external interfaces 310 to block and/or page addresses targeting one or more flash die 394, via mapping provided by table 343. In some embodiments, a granularity of map 341 is fixed, such as mapping first fixed-sized logical blocks used on the external interfaces 310 to second fixed-sized blocks used on the device interfaces 390. In other embodiments, a granularity of map 341 is variable and not all blocks used on either the external interfaces 310 or the device interfaces 390 are necessarily a same size.

In some embodiments, table 343 associates logical page addresses with a respective map entry, where the logical page addresses are a portion of and/or are derived from the LBA, and the map entry identifies a portion of the non-volatile memory. For example, in some embodiments, the logical page address is a higher-order portion of the LBA, and a lower-order portion of the LBA is an offset within a logical page specified by the logical page address.

In some embodiments, the map entry identifies the portion of the non-volatile memory as a base address, such as a read unit address, and a length, such as a number of read units. In some embodiments, the read units are sequential in locations in an address space of the non-volatile memory. In further embodiments, the read units are striped across a plurality of flash die (such as flash die 394) and/or flash devices (such as flash devices 392).

In some embodiments, map 341 uses table 343 to perform and/or to look up translations between addresses used on the external interfaces 310 and data addressing used on the device interfaces 390. According to various embodiments, table 343 is one or more of: a one-level map; a two-level map; a multi-level map; a map cache; a compressed map; any type of mapping from one address space to another; and any combination of the foregoing. According to various embodiments, table 343 includes one or more of: static random access memory (SRAM); dynamic random access memory (DRAM); non-volatile memory (such as flash memory); cache memory; on-chip memory; off-chip memory; and any combination of the foregoing.

In some embodiments, the recycler module 351 performs garbage collection. For example, in some embodiments, flash devices 392 contain blocks that must be erased before the blocks are re-writeable. The recycler module 351 is enabled to determine which portions of the flash devices 392 are actively in use, such as by scanning a map maintained by map 341, and to make unused portions of flash devices 392 available for writing by erasing them. In further embodiments, the recycler module 351 is enabled to move data stored within the flash devices 392 to make larger contiguous portions of the flash devices 392 available for writing.

The CPU 371 controls various portions of SSD controller 300. The CPU 371 includes a CPU core 372. The CPU core 372 is, according to various embodiments, one or more single-core or multi-core processors. The individual processor cores in the CPU core 372 are, in some embodiments, multi-threaded. The CPU core 372 includes instruction and/or data caches and/or memories. For example, the instruction memory contains instructions to enable the CPU core 372 to execute software (sometimes called firmware) to control the SSD controller 300. In some embodiments, some or all of the firmware executed by the CPU core 372 is stored on the flash devices 392.

In various embodiments, the CPU 371 further includes: a command management module 373 to track and control commands received via the external interfaces 310 while the commands are in progress; a buffer management module 375 to control allocation and use of the buffer 331; a translation management module 377 to control the map 341; a coherency management module 379 to control consistency of data addressing and to avoid conflicts such as between external data accesses and recycle data accesses; a device management module 381 to control device interface logic 391; and optionally other management units. In one example, the device management module 381 may be configured to implement a read disturb effect determination process in accordance with embodiments of the present invention. None, any, or all of the management functions performed by the CPU 371 are, according to various embodiments, controlled and/or managed by hardware, by firmware, by software (such as software executing on the CPU core 372 or on a host connected via the external interfaces 310), or any combination thereof. The device management module 381 may be implemented as part of the CPU 371, or could be implemented in hardware, or could be implemented by a combination of firmware running on the CPU 371 and hardware.

In some embodiments, the CPU 371 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to the SSD controller 300 and is compatible with operation with various computing hosts, such as via adaptation of the host interface 311 and/or the external interface 310. The various computing hosts include one or any combination of a computer, a workstation computer, a server computer, a storage server, a PC, a laptop computer, a notebook computer, a netbook computer, a FDA, a media player, a media recorder, a digital camera, a cellular handset, a cordless telephone handset, and an electronic game.

In various embodiments, all or any portion of an SSD controller 300 (or a computing-host flash memory controller) are implemented on a single integrated circuit (IC), a single die of a multi-die IC, a plurality of dice of a multi-die IC, or a plurality of ICs. For example, the buffer 331 is implemented on a same die as other elements of the SSD controller 300. For another example, the buffer 331 is implemented on a different die than other elements of SSD controller 300.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions represented by the diagrams of FIGS. 4-5 may, in some embodiments, be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

Embodiments of the present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a non-volatile memory; and
   a controller coupled to said non-volatile memory and configured to (i) accumulate a read disturb count for a first region of said non-volatile memory, (ii) accumulate error statistics for a second region of said non-volatile memory, and (iii) determine, based upon both the read disturb count and the error statistics, whether the first region has reached a read disturb limit, wherein in response to determining that the first region has not reached the read disturb limit, said controller adjusts the accumulated read disturb count based upon the error statistics, and in response to determining that the first region has reached the read disturb limit, the controller relocates at least some data of the first region.

2. The apparatus according to claim 1, wherein the second region is the same as the first region.

3. The apparatus according to claim 1, wherein the first region is an integer number of blocks of the non-volatile memory.

4. The apparatus according to claim 1, wherein the controller increments the read disturb count for each read of a page of the non-volatile memory within the first region.

5. The apparatus according to claim 1, wherein the controller is further configured to adjust the read disturb count based at least in part upon the error statistics when the read disturb count reaches a read disturb count threshold.

6. The apparatus according to claim 1, wherein the controller is further configured to compute a maximum percentage of an error correcting ability used in correcting data read from the second region.

7. The apparatus according to claim 6, wherein each of a plurality of sub-regions of the second region uses a different error correction code rate.

8. The apparatus according to claim 1, wherein the controller is configured to determine whether the first region has reached the read disturb limit by comparing the read disturb count to a read disturb count threshold and comparing the error statistics to an error statistics threshold.

9. The apparatus according to claim 1, wherein the controller is further configured to (i) clear the read disturb count in response to erasing the first region and (ii) reset the error statistics in response to erasing the second region.

10. A method of read disturb effect determination comprising the steps of:
    accumulating a read disturb count for a first region of a non-volatile memory;
    accumulating error statistics for a second region of the non-volatile memory;
    determining, based upon both the read disturb count and the error statistics, whether the first region has reached a read disturb limit;
    in response to determining that the first region has not reached the read disturb limit, adjusting the accumulated read disturb count based upon the error statistics; and
    in response to determining that the first region has reached the read disturb limit, relocating at least some data of the first region.

11. The method according to claim 10, wherein the second region is the same as the first region.

12. The method according to claim 10, wherein the first region is an integer number of blocks of the non-volatile memory.

13. The method according to claim 10, wherein the step of accumulating the read disturb count comprises incrementing the read disturb count for each read of a page of the non-volatile memory within the first region.

14. The method according to claim 10, wherein the step of accumulating the read disturb count further comprises adjusting the read disturb count based at least in part upon the error statistics when the read disturb count reaches a read disturb count threshold.

15. The method according to claim 10, wherein the step of accumulating the error statistics comprises computing a maximum percentage of an error correcting ability used in correcting data read from the second region.

16. The method according to claim 15, wherein each of a plurality of sub-regions of the second region uses a different error correction code rate.

17. The method according to claim 10, wherein the step of determining whether the first region has reached the read disturb limit comprises comparing the read disturb count to a read disturb count threshold and comparing the error statistics to an error statistics threshold.

18. The method according to claim 10, further comprising:
    in response to erasing the first region, clearing the read disturb count.

19. The method according to claim 10, further comprising:
    in response to erasing the second region, resetting the error statistics.

20. The method according to claim 10, wherein the data of the first region that is relocated is active data of the first region.

* * * * *